United States Patent [19]

Richter et al.

[11] Patent Number: 4,647,845
[45] Date of Patent: Mar. 3, 1987

[54] APPARATUS AND METHOD FOR UTILIZING AN AC DETECTION SCALAR NETWORK ANALYZER WITH A CW SIGNAL SOURCE

[75] Inventors: Kenneth A. Richter, Santa Rosa; M. D. Sohigian, Healdsburg; John C. Faick, Santa Rosa, all of Calif.

[73] Assignee: Hewlett-Packard Company, Palo Alto, Calif.

[21] Appl. No.: 652,545

[22] Filed: Sep. 20, 1984

[51] Int. Cl.⁴ .............................................. G01R 27/00
[52] U.S. Cl. ................................ 324/57 R; 324/57 SS
[58] Field of Search ............... 324/57 SS, 57 R, 57 Q, 324/58 R, 58.5 R, 77 C; 364/486; 455/226

[56] References Cited

U.S. PATENT DOCUMENTS 3,968,427 7/1976 Sharrit .............................. 324/57 SS

FOREIGN PATENT DOCUMENTS 0528941 8/1956 Canada ................................. 455/226

OTHER PUBLICATIONS

Jacobsen: "Swept-Frequency Measurements . . . " HP Journal May 1978-p. 24.
Brinkoetter: "Swept-Measurements Speeds . . . " Microwaves, Apr. 1977, pp. 48–52.
Unrau: "Leveled Sub-Microwave Sweep Measurements . . . "-Proceedings European Microwave Conference-Sep. 1978-pp. 503–507.
Thomas: "Cable Systems Measurements . . . " T.V. Communications-Oct. 77-pp. 58–63.
"Very-Low-Level Microwave Power Measurements" by Ronald E. Pratt from the HP Journal, Feb. 1976.
"Microelectronics Enhances Thermocouple Power Measurements", by John C. Lamy from the HP Journal-Sep. 19.

Primary Examiner—Gerard R. Strecker
Assistant Examiner—Jose M. Solis
Attorney, Agent, or Firm—Patrick J. Barrett; Joseph H. Smith

[57] ABSTRACT

A method and apparatus for using an AC detection network analyzer with either a pulsed RF or a CW source signal is disclosed. An AC/DC detector is placed between an AC detection network analyzer and a device under test. If a source signal is a pulsed RF signal the AC/DC detector can be switched to transform the pulsed RF signal to produce an AC signal for the network analyzer. If the signal source is a CW signal, the AC/DC detector can be switched to rectify the CW signal, modulate the CW signal, sample the CW signal, and filter the CW signal. This will also produce the AC signal for the network analyzer.

11 Claims, 7 Drawing Figures

APPARATUS AND METHOD FOR UTILIZING AN AC DETECTION SCALAR NETWORK ANALYZER WITH A CW SIGNAL SOURCE

BACKGROUND OF THE INVENTION

Scaler network analysis is a method of measuring the magnitude of transmission and impedance of a circuit as a function of the frequency of an input signal. Scaler network analyzers are devices for measuring impedance and transmission functions of linear networks at specific frequencies or over predetermined frequency ranges. There are two primary types of scaler network analyzers: AC detection and DC detection.

In DC detection network analysis, an unmodulated or CW signal is supplied to a device under test. An output CW signal from the device under test is supplied to a DC network analyzer. The CW signal is rectified by the DC network analyzer to produce a DC signal with a magnitude related to the amplitude of the CW signal supplied to the DC network analyzer. The DC network analyzer displays the magnitude of the DC signal as a function of the frequency of the corresponding CW signal.

In AC detection network analysis, a modulated or pulsed RF signal is supplied to a device under test. The pulsed RF signal is output from the device under test and supplied to an AC network analyzer. The pulsed signal is rectified by the AC network analyzer to produce an AC signal modulated at a predetermined frequency. The AC signal has an amplitude related to the amplitude of the pulsed RF signal supplied to the AC network analyzer. The AC network analyzer displays the amplitude of the AC signal as a function of the frequency of the corresponding pulsed RF signal.

The major disadvantage of AC detection network analysis is that some devices do not respond properly to a pulsed RF signal Some examples of these devices are narrow bandwidth filters, active devices that are power sensitive, and some feedback loop systems. In these situations, the signal supplied to the device under test must be a CW signal, thus requiring DC detection. There are several network analysis configurations used when the signal supplied to the device under test must be a CW signal, however none have been completely satisfactory. One of the configurations utilizes an external modulator placed between the device under test and the AC network analyzer, while another configuration uses a DC detection network analyzer.

The use of a modulator placed between the device under test and the AC detection network analyzer has some major drawbacks. A significant error could be introduced as a result of the modulator's attenuation and SWR variation.

The alternative solution of using a DC network analyzer has several drawbacks of its own. DC network analyzers have a limited dynamic range due to broadband noise from the signal source. Typical broadband sweepers limit the low sensitivity measurement to about −40 dBm due to this noise. Additionally, drift associated with DC coupled amplifiers will introduce a significant error when measuring input signals near or below −50dBm.

SUMMARY OF THE INVENTION

According to the preferred embodiment of the present invention, an AC detection network analyzer is enabled to respond to a CW signal source with constant but minimal attenuation and SWR variation. The AC detection network analyzer is provided with a test signal and a reference signal. The reference signal supplies the AC detection network analyzer with the frequency of the test signal. The test signal must be an AC signal modulated at a predetermined frequency. A swept frequency signal oscillator is used to generate two signals: the reference signal and a source signal. The source signal is supplied to a device under test and an output signal from the device under test is supplied to an AC/DC detector. An output signal from the AC/DC detector is supplied to the AC detection network analyzer as the test signal.

The AC/DC detector can operate in two modes. If the source signal is a CW signal, the AC/DC detector must be switched to a DC detection mode. If the source signal is a pulsed RF signal, the AC/DC detector must be switched to an AC detection mode. If the AC/DC detector is switched to the DC detection mode, the AC/DC detector must produce a corresponding AC signal with an amplitude related to the amplitude of the CW signal. First, the AC/DC detector transforms the source signal to produce a transformed signal. Next, the transformed signal is chopped at a predetermined frequency to produce a modulated signal. After modulation, the AC/DC detector amplifies the modulated signal to produce an amplified signal. The amplified signal is sampled twice each cycle of the original modulation frequency to produce a sampled signal. Finally, the AC/DC detector removes from the sampled signal any feedthrough generated by the sampler to produce an output signal from the AC/DC detector. It is this output signal that is supplied to the AC detection network analyzer as the test signal.

If the AC/DC detector is switched to the AC detection mode, the AC/DC detector does not chop the source signal. Here, the AC/DC detector only rectifies and amplifies the source signal. This produces an output signal that is an AC signal. The AC/DC detector supplies the AC signal to the AC network analyzer as the test signal.

DETAILED DESCRIPTION OF THE PREFERRED EMBODIMENT

Figure 1:
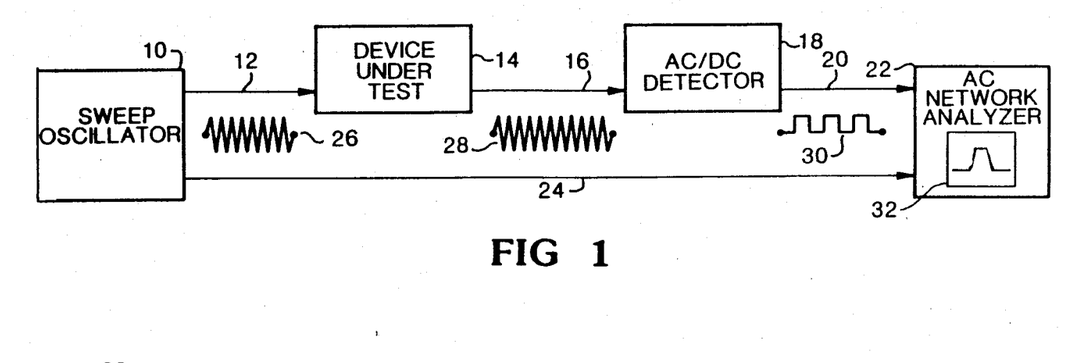
FIG. 1 shows a block diagram of an arrangement for analyzing the amplitude response of a device under test to an RF signal.

FIG. 1 shows a sweep oscillator 10 connected to a device under test 14 and a scalar AC network analyzer 22. Sweep oscillator 10 supplies to device under test 14 a RF signal 26 on a line 12 at various frequencies over a frequency range from 10 MHz to 26 GHz. Sweep oscillator 10 also supplies a sweep signal on a line 24 to AC network analyzer 22. This sweep signal is linearly proportional in magnitude to the frequency of RF signal 26. Although this preferred embodiment discloses an analog sweep signal, a digital sweep signal, which represents the frequency of RF signal 26, could also be used.

An AC/DC detector 18 receives an RF signal 28 on a line 16 from device under test 14. AC/DC detector 18 can operate in two modes an AC detection mode and a DC detection mode. While in the DC detection mode, AC/DC detector 18 both chops and samples RF signal 28. While in the AC detection mode, AC/DC detector 18 will neither chop nor sample RF signal 28. When RF signal 28 is a CW signal AC/DC detector 18 must be in the DC detection mode and when RF signal 28 is a pulsed RF signal, AC/DC detector 18 must be in the AC detection mode. In both configurations, AC/DC detector 18 supplies a modulated signal 30, illustrated by waveform S5 in FIG. 7, on a line 20 to AC network analyzer 22. Network analyzer 22 displays the modulated signal on a display device 32.

Figure 2:
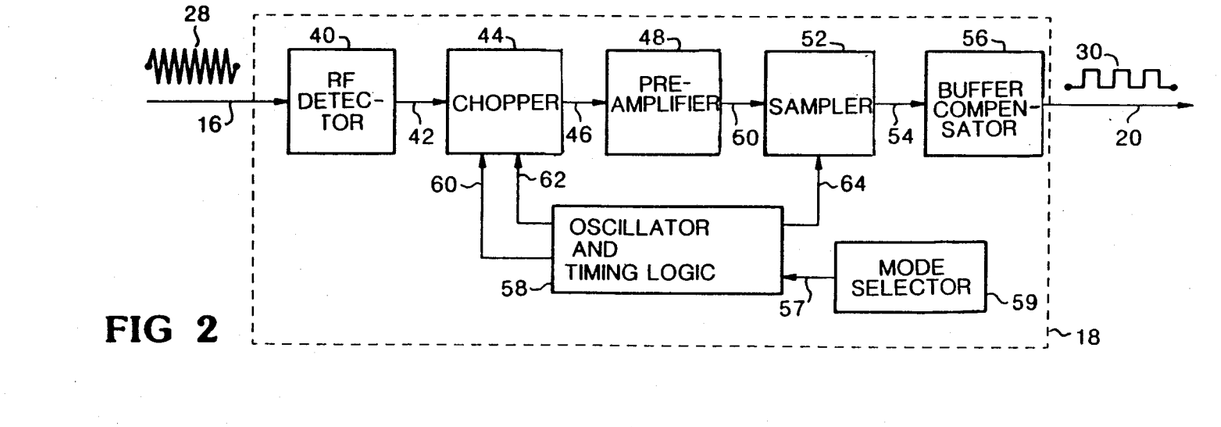
FIG. 2 shows a block diagram of the preferred embodiment of the present invention.

FIG. 2 shows a block diagram of AC/DC detector 18. AC/DC detector 18 includes an RF detector 40 that is connected to a chopper 44. RF detector 40 detects RF signal 28 supplied on line 16 and transroms it into a rectified signal supplied on a line 42. The magnitude of the rectified signal supplied on line 42 is proportional to the amplitude of RF signal 28.

In the DC detection mode, chopper 44 modulates the rectified signal supplied on line 42 to produce a modulated signal supplied on a line 46. In the AC detection mode, chopper 44 simply supplies the modulated signal, unaltered, on line 42. In the AC detection mode, chopper 44 does not modulate the rectified signal because when a pulsed RF signal is rectified, that rectified signal is already a modulated signal.

The modulated signal supplied on line 46 is amplified by a preamplifier 48 to produce an amplified signal supplied on a line 50. In the DC detection mode, this amplified signal supplied on line 50 is sampled by a sampler 52 to produce a sampled signal, illustrated by waveform S4 in FIG. 7, supplied on a line 54. Sampling is done to eliminate any feedthrough generated by chopper 44. In the AC detection mode, no sampling is needed since no chopping has taken place. Here, sampler 52 simply supplies the amplified signal on line 54 as the sampled signal.

A buffer-compensator 56 buffers the sampled signal supplied on line 54 and removes from the sampled signal supplied on line 54 an unwanted signal due to a parasitic capacitance of sampler 52. This produces modulated signal 30 supplied on line 20.

Oscillator and timing logic 58 controls both chopper 44 and sampler 52. Chopper 44 is controlled by a first control signal supplied on a line 60 and a second control signal supplied on a line 62. Sampler 52 is controlled by a third control signal supplied on a line 64. As described in greater detail later, the first control signal and the second control signal opens and closes chopper 44. The third control signal opens and closes sampler 52.

Figure 3:
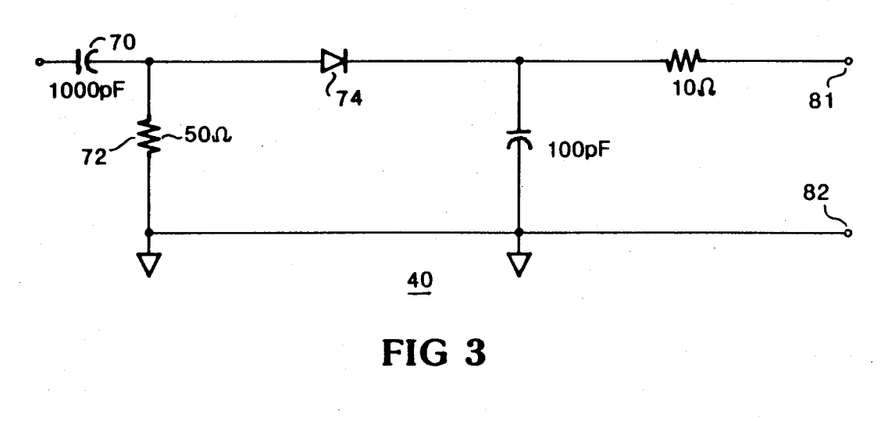
FIG. 3 shows a schematic diagram of an RF detector circuit.

Oscillator and timing logic 58 is controlled by a mode selector 59. Mode selector 59 establishes in which mode AC/DC detector 18 will be set. While set in the AC detection mode, timing and oscillator logic 58 provides the first and second control signals to chopper 44 and the third control signal to sampler 52 such that no chopping or sampling is done. While set in the DC detection mode, timing and oscillator logic 58 provides chopper 44 with the first and second control signals which open and close chopper 44 at a frequency of 27.77 kHz, and sampler 52 with the third control signal which open and close the sampler at a frequency of 55.55 kHz. Both modes supply modulated signal 30 on line 20. FIG. 3 shows a circuit diagram for RF detector 40. A coupling capacitor 70 is used to block out any DC signal input. A resistor 72 creates a fifty ohm broadband input impedance for RF detector 40. The RF signal is rectified by a zero bias Schottky barrier diode 74. A rectified signal is supplied at a node 81. A node 82 is a ground connection for RF detector 40.

Figure 4:
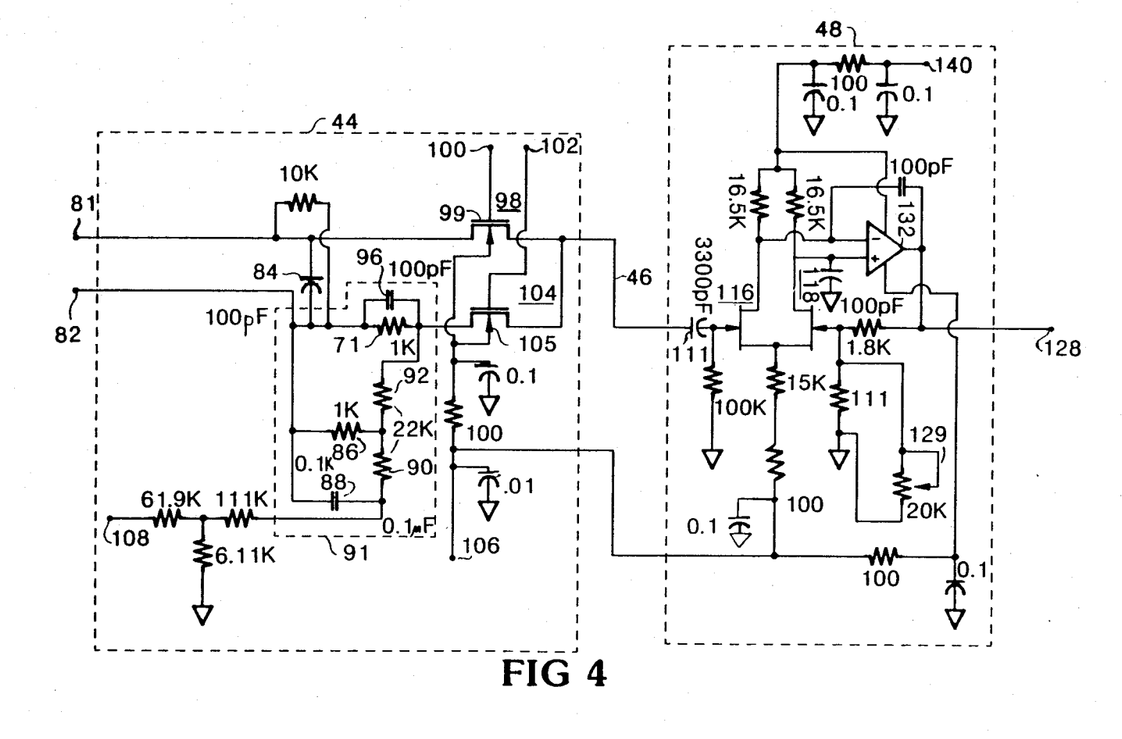
FIG. 4 shows a schematic diagram of a chopper circuit and a preamplifier circuit.

FIG. 4 shows circuit diagrams for chopper 44 and preamplifier 48. Chopper 44 comprises a series-shunt chopper circuit and a ladder attenuator 91. A series-shunt chopper consists of two switches, the first switch connected in series with the input and output of the circuit and the second switch connected in shunt across the output of the circuit. When a series FET 98 is conductive a shunt FET 104 will be non-conductive. This will allow the rectified signal to pass directly from a node 81 to a coupling capacitor 114 in preamplifier 48. When series FET 98 is non-conductive shunt FET 104 will be conductive. Here, any leakage of current through series FET 98 will be be grounded through shunt FET 104 and away from preamplifier 48.

Figure 7:
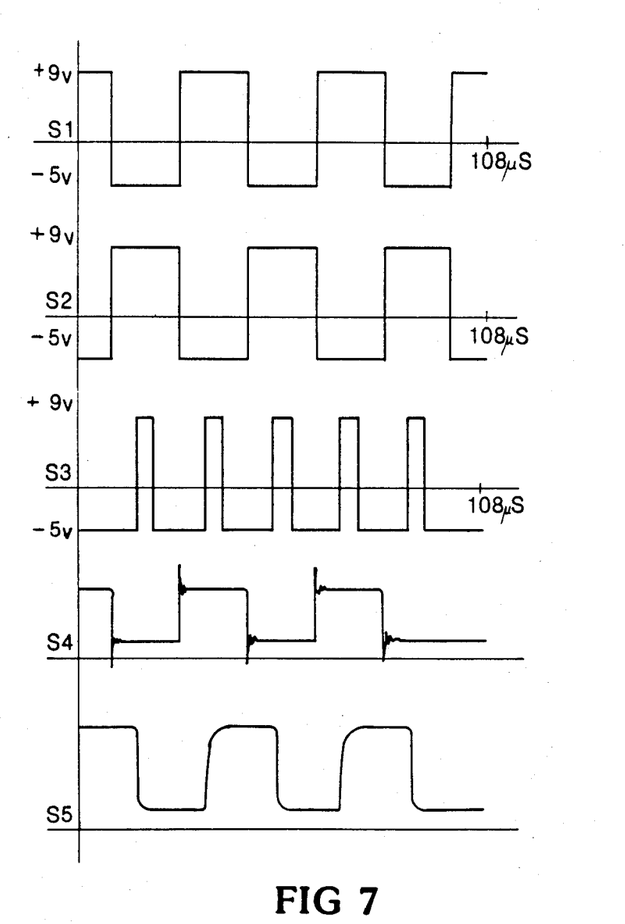
FIG. 7 is a timing diagram illustrating the operation of the preferred embodiment.

The first control signal is received at a node 100. When a high voltage (+9v) is supplied at node 100 series FET 98 becomes conductive. Shunt FET 104 is controlled in the same manner. The second control signal is received at a node 102. When a high voltage (+9v) is applied at node 102 shunt FET 104 becomes conductive. However, shunt FET 104 is only made conductive when series FET 98 is made nonconductive and series FET 98 is only made conductive when shunt FET 104 is made nonconductive. In order to accomplish this, the first and second control signals must be complementary. The first and second control signals, which make FET 98 and FET 104 conductive and nonconductive, are illustrated in FIG. 7 by waveforms S1 and S2, respectively. additionally, a substrate terminal 99 of series FET 98 and a substrate terminal 105 of shunt FET 104 are connected to a −12v power supply at a node 106.

The modulated signal supplied on line 46 enters preamplifier 48 through coupling capacitor 114. Preamplifier 48 is a compound type amplifier. A first FET 116 and a second FET 118 comprise a dual FET input stage of preamplifier 48. An operational amplifier 132 is used as the output stage of preamplifier 48. The dual FET input stage is used both to reduce the noise level of preamplifier 48 and to allow operation of preamplifier 48 at low input voltage levels. A variable resistor 124 is used to adjust the gain of preamplifier 48. Preamplifier 48 is connected to a power supply at a node 140 and node 106. An amplified signal is supplied to a node 128.

Figure 5:
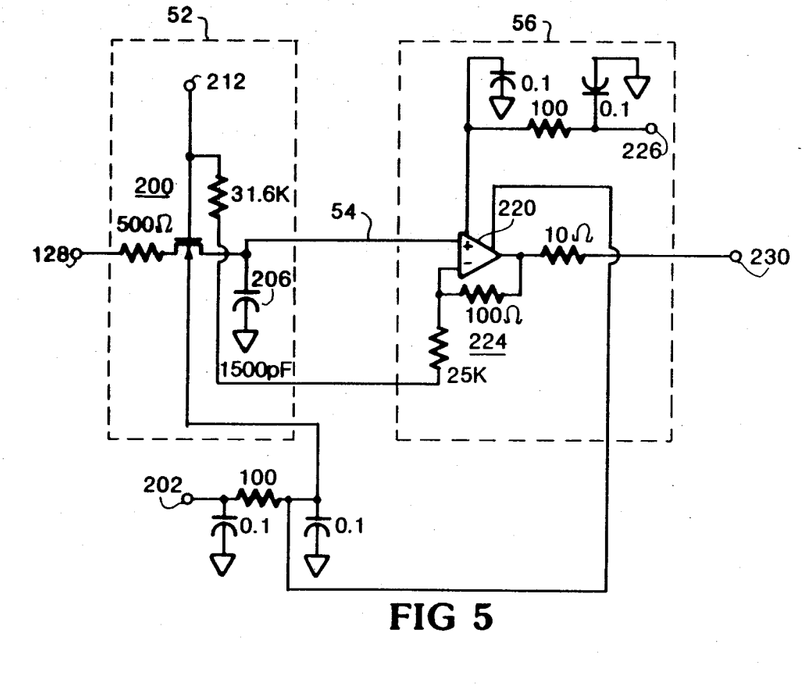
FIG. 5 shows a schematic diagram of a sampler circuit and a buffer-compensator circuit.

FIG. 5 shows the circuit diagram for sampler 52 and buffer-compensator 56. The amplified signal is supplied to sampler 52 at node 128. A FET 200 is used to sample the amplified signal twice every cycle of modulation of the amplified signal to produce a sampled signal. FET 200 is connected to the oscillator and timing logic at a node 212. To sample the amplified signal, the oscillator and timing logic supplies a high voltage (+9v) to node 212. A high voltage at node 212 will make FET 200 conductive, thus allowing the amplified signal to be stored on a capacitor 206. The third control signal supplied by the oscillator and timing logic to node 212, which makes FET 200 conductive and nonconductive, is illustrated by waveform S3 in FIG. 7.

Buffer-compensator 56 is a unity gain follower used both to buffer the voltage held on capacitor 206 and to supply the modulated signal to a node 230. Buffer-compensator 56 is composed of an operational amplifier 220 and a resistive feedback network 224. The sampled signal is supplied to a positive input of operational amplifier 220 and the third control signal is supplied to a negative input of operational amplifier 220. Operational amplifier 220 will subtract the sampler signal from the sampled signal, thus removing any additional signal introduced into the sampled signal by the parasitic capacitance of sampler 52. The parasitic capacitance of sampler 56 is due to a gate-drain capacitance of FET 200. Operational amplifier 220 is connected to a +15v power supply at a node 226 and a −12v power supply at a node 202.

Figure 6:
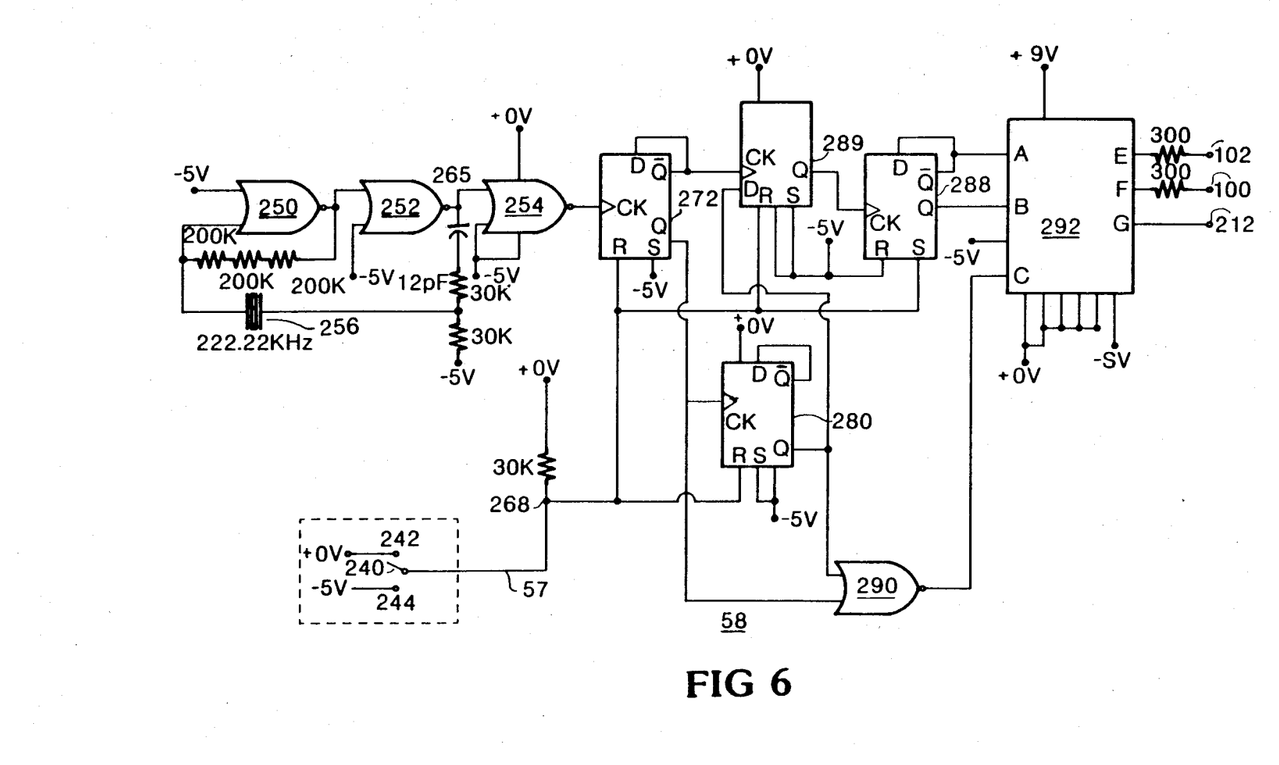
FIG. 6 shows a schematic diagram of an oscillator and timing logic circuit and a mode selector circuit.

FIG. 6 shows a circuit diagram for the oscillator and timing logic 58 and mode selector 59. A crystal 256, a NOR gate 250 and a NOR gate 252 comprise a crystal-gate oscillator that supplies a signal, oscillating at 222.22 kHz, to a node 265. A NOR gate 254 is used to buffer and clean up the signal supplied at node 265. The signal leaving nor gate 254 and entering the clock node (CK) of a flip-flop 272 is oscillating between +0v and −5v at 222.22 kHz.

Mode selector 59 establishes in which mode AC/DC detector 18 is to be set. This is accomplished by supplying a control voltage on a line 57 to a node 268. When a switch 240 is connected to a node 242, a control voltage of +0v is supplied on line 57 to node 268. When switch 240 is connected to a node 244, a control voltage of −5v is supplied on line 57 to node 268. Although this preferred embodiment discloses mode selector 59 as simply a switch, any electronic switching device, such as a comparator or a NOR gate, could also be used.

When the control voltage is low (−5v), the AC/DC detector is switched into the DC detection mode. Here, flip-flop 272, a flip-flop 282, and a flip-flop 288 operate together to divide the frequency of a signal supplied to a clock node (CK) of flip-flop 272 by eight. This results in a signal supplied at a node A and a node B of level shifter 292 that oscillates between +0v and −5v at 27.77 kHz. Likewise, flip-flop 272 and flip-flop 280 divide the frequency of the signal supplied to clock node (CK) of flip-flop 272 by four. This will result in a signal supplied at a node C of level shifter 292 that oscillates between +0v and −5v at 55.54 kHz.

Level shifter 292 is used to translate an input voltage at node A, B, or C into a corresponding output voltage at a node E, F, or G. This voltage translation is needed so that the FETs in the sampler and chopper operate properly. Any +0v signal at node A, B, or C of level shifter 292 will be translated into a +9v signal at node E, F, or G. Likewise, a −5v signal at node A, B, or C will be translated into a −5v signal at node E, F, or G. The signals supplied to nodes 102, 100, and 212 from nodes E, F, and G, while in the DC mode, are illustrated in FIG. 7 by graphs S1, S2, and S3, respectively.

When the control voltage is high (+0v), the AC/DC detector is switched into the AC detection mode. Here, flip-flops 272, 282, 288, and 276 are frozen so that the signals supplied at nodes A, B, and C of level shifter 292 are DC signals. The DC signals at nodes B and C of level shifter 292 have high voltages (+0v), while the DC signal at node A of level shifter 292 has a low (−5v). Here, level shifter 292 will supply signals to nodes 102, 100, and 212 from nodes E, F, and G, respectively, that do not oscillate. The signal that is supplied to node 100 and 212 are both +9v DC signals, while the signal supplied at node 102 is a −5v DC signal.

We claim:

1. An apparatus to be used as a detector for enabling an AC scaler analyzer to perform both AC and DC measurements, wherein AC refers to a modulated microwave signal and DC refers to a CW microwave signal, the apparatus comprising:

input means for receiving an input microwave signal;

transforming circuit means, having an input and an output, the input being connected to the input means, for transforming the input signal into a transformed signal having a magnitude related to the amplitude of the input signal;

modulating circuit means, having an input and an output, the input being connected to the transforming circuit means output;

mode means for providing a mode signal to the modulating circuit means indicating a selection of either AC detection on DC detection;

the modulating circuit means in response to the mode signal indicating selection of DC detection for modulating the transformed signal at a predetermined frequency to produce an output signal that is modulated such that the amplitude of the modulated output signal is related to the magnitude of the transformed signal, and in response to the mode signal indicating selection of AC detection for amplifying the transformed signal without modulating the transformed signal to produce an output signal; and output means for coupling the output signal of the modulating circuit means to the AC scaler analyzer.

2. An apparatus as in claim 1 wherein the modulating circuit means comprises:

chopper means, having an input and an output, the input being connected to the transforming circuit means output, for chopping the transformed signal at the predetermined frequency to produce an output signal that is chopped when the mode signal indicates DC detecton, and for producing an output signal that is proportional to the transformed signal when the mode signal indicates AC detection; and sampler means having an input and an output, the input being connected to the chopper means output, for sampling the chopped signal at twice the frequency of the chopped signal to produce an output signal that is sampled when the mode signal indicates DC detection, and for providing an output signal that is equal to the chopper means output signal when the mode signal indicates AC detection.

3. An apparatus as in claim 2 wherein the modulating circuit means further comprises a timing means, having a first output connected to a chopper means and a second output connected to a sampler means, for controlling when the chopper and sampler means will be opened and closed in response to the mode signal.

4. An apparatus as in claim 3 wherein the chopper means further comprises:
- a first transistor, having a first electrode connected to the transforming circuit means output, a second electrode connected to the sampling circuit means input, and a third electrode connected to the first output of the timing means that can be made conductive and nonconductive at the predetermined frequency for chopping the transformed signal; and
- a second transistor, having a first electrode connected to the second electrode of the first transistor, a second electrode connected to a ground potential, and a third electrode connected to the first output of the timing means, that can be made conductive and nonconductive at the predetermined frequency for chopping the transformed signal.

5. An apparatus as in claim 3 wherein the sampler means further comprises:
- a third transistor, having a first electrode connected to the modulating circuit means output, a second electrode, and a third electrode connected to the second output of the timing means, that can be made conductive and nonconductive for sampling the chopped signal;
- a capacitor, having a first terminal connected to the second electrode of the third transistor and a second terminal connected to a ground potential, for holding the sampled signal; and
- a compensator circuit means, having an input connected to the first terminal of the capacitor and an output connected to the modulating circuit means output, for removing any feedthrough generated by the sampler means.

6. An apparatus for processing an electromagnetic signal comprising:
- a sweeper means for producing an electromagnetic signal at a plurality of frequencies over a predetermined frequency range, the sweeper having a first output means for supplying the electromagnetic signal to a device under test and a second output means for supplying a sweep signal indicative of the frequency of the electromagnetic signal;
- a detector means for detecting an input signal and converting the input signal into a modulated signal, the detector having an input means for receiving the input signal, and a transforming circuit means, having an input and an output, the transforming circuit means input being connected to the input means, for transforming the input signal into a transformed signal having a magnitude related to the amplitude of the input signal;
- control means, having an input and an output, the output being connected to the detector means, for configuring the detector means for an AC detection mode and a DC detection mode; and
- an analyzer means for analyzing electromagnetic signals, the analyzer means having a first input means for receiving the modulated signal, a second input means for receiving the sweep signal, and a processing circuit means for processing the modulated and sweep signals to produce a processed signal, and a display means, connected to the processing circuit means, for displaying the processed signals.

7. An apparatus as in claim 6 wherein the detector means further comprises a modulating circuit means, having an input and an output, the modulating circuit means input being connected to the transforming circuit means output, the modulating circuit means, only being operative in the AC detection mode, for modulating the transformed signal at a predetermined frequency such that the amplitude of the modulated signal is related to the magnitude of the transformed signal;

8. An apparatus as in claim 7 wherein the modulating circuit means further comprises:
- a chopper means, having an input and an output, the input being connected to the transforming circuit means output, for chopping the transformed signal at the predetermined frequency to produce a chopped signal; and
- a sampler means, having an input and an output, the input being connected to the chopper means output, for sampling the chopped signal at twice the frequency of the chopped signal to produce a sampled signal.

9. An apparatus as in claim 8 wherein the modulating circuit means further comprises a timing means, having a first output connected to a chopper means and a second output connected to a sampler means, for controlling when the chopper and sampler means will be opened and closed.

10. An apparatus as in claim 9 wherein the chopper means further comprises:
- a first transistor, having a first electrode connected to the transforming circuit means output, a second electrode connected to the sampling circuit means input, and a third electrode connected to the first output of the timing means that can be made conductive and nonconductive at the predetermined frequency for chopping the transformed signal; and
- a second transistor, having a first electrode connected to the second electrode of the first transistor, a second electrode connected to a ground potential, and a third electrode connected to the first output of the timing means, that can be made conductive and nonconductive at the predetermined frequency for chopping the transformed signal.

11. An apparatus as in claim 9 wherein the sampler means further comprises:
- a third transistor, having a first electrode connected to the modulating circuit means output, a second electrode, and a third electrode connected to the second output of the timing means, that can be made conductive and nonconductive for sampling the chopped signal;
- a capacitor, having a first terminal connected to the second electrode of the third transistor and a second terminal connected to a ground potential, for holding the sampled signal; and
- a compensator circuit means, having an input connected to the first terminal of the capacitor and an output connected to the modulating circuit means output, for removing any feedthrough generated by the sampler means.

* * * * *